(12) United States Patent
Tsuzuki

(10) Patent No.: US 6,333,646 B1
(45) Date of Patent: Dec. 25, 2001

(54) ABNORMAL CLOCK DETECTOR AND ABNORMAL CLOCK DETECTING APPARATUS

(75) Inventor: Takayuki Tsuzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,082

(22) Filed: Nov. 3, 2000

Related U.S. Application Data

(63) Continuation of application No. PCT/JP99/02405, filed on May 10, 1999.

(30) Foreign Application Priority Data

May 13, 1998 (JP) .................................. 10-130633

(51) Int. Cl.7 ................................ H03K 9/06; H03K 5/22
(52) U.S. Cl. .................................................. 327/47; 327/40
(58) Field of Search ................................... 327/18, 26, 36, 327/37, 38, 40–47, 49, 176, 292, 293, 295, 296

(56) References Cited

U.S. PATENT DOCUMENTS 5,734,970 * 3/1998 Saito ....................................... 455/76
6,072,370 * 6/2000 Nakamura ............................. 331/25

FOREIGN PATENT DOCUMENTS

| A 62-35930 SHO | 2/1987 | (JP) . |
|---|---|---|
| 63-191411 | 8/1988 | (JP) . |
| A 1-319325 | 12/1989 | (JP) . |
| A 4-130508 | 5/1992 | (JP) . |
| A 4-306930 | 10/1992 | (JP) . |
| A 5-324118 | 12/1993 | (JP) . |
| HEI 5-336095 | 12/1993 | (JP) . |
| HEI 7-319576 | 12/1995 | (JP) . |
| HEI 8-65287 | 3/1996 | (JP) . |
| HEI 9-244761 | 9/1997 | (JP) . |
| A 9-292928 | 11/1997 | (JP) . |

* cited by examiner

Primary Examiner—My-Trang Nu Ton
(74) Attorney, Agent, or Firm—Sughrue Mion, PLLC

(57) ABSTRACT

Frequencies of clocks CLK1 and CLK2 are divided in frequency divider circuits (11 to 14), frequency-divided clocks CLK1A and CLK1B are input into clock comparators (15) and (16). Frequency-divided clocks CLK2A and CLK2B are input into clock comparators (15) and (16). The clock comparator (15) counts the number of pulses of the clock CLK1A based on the clock CLK2B and outputs an error signal ERR1. The clock comparator (16) counts the number of pulses of the clock CLK2B based on the clock CLK1B and outputs an error signal ERR2. An abnormal clock is detected by examining states of the error signals ERR1 and ERR2.

4 Claims, 12 Drawing Sheets

BOTH CLK1 AND CLK2 ARE NORMAL

FREQUENCY OF CLK2 IS TOO HIGH

FREQUENCY OF CLK2 IS TOO LOW

FREQUENCY OF CLK1 IS TOO HIGH

FREQUENCY OF CLK1 IS TOO LOW

CLK1 IS STOPPED AT "H" LEVEL

CLK1 IS STOPPED AT "L" LEVEL

CLK2 IS STOPPED AT "H" LEVEL

ABNORMAL CLOCK DETECTOR AND ABNORMAL CLOCK DETECTING APPARATUS

This appln. is a continuation of PCT/JP99/02405 filed May 10, 1999.

TECHNICAL FIELD

The present invention relates to an abnormal clock detector and an abnormal clock detecting apparatus for detecting a stop or an abnormal oscillation of a clock in an information processing apparatus.

BACKGROUND ART

An abnormal clock detector is disclose, f or example, in Japanese Patent Application Laid-open No. 4-306930. In this abnormal clock detector, as shown in FIG. 16, two different clocks ($CK_1$ and $CK_2$) are compared with each other to detect which one of them is abnormal.

In the conventional abnormal clock detector shown in FIG. 16, since an abnormal clock is detected, the clocks $CK_1$ and $CK_2$ having different duty ratio or frequency are input a frequency divider 100 and a frequency divider 101, respectively. Frequency of the input clocks $CK_1$ and $CK_2$ are respectively divided by frequency division ratios $M_1$ and $M_2$ in the frequency divider 100 and the frequency divider 101. The clock $CK_1$ whose frequency was divided in the frequency divider 100 is output from the frequency divider 100 as a clock $CK_4$ having frequency $f_4$. The clock $CK_2$ whose frequency was divided in the frequency divider 101 is output from the frequency divider 101 as a clock $CK_3$ having frequency $f_3$. The clock $CK_3$ is input into a timing generator 102. Here, the frequency division ratios $M_1$ and $M_2$ are arbitrary natural numbers satisfying a relation of $2 \cdot f_4 \geq f_3$.

The clock $CK_4$ output from the frequency divider 100 are input into counters 103 and 104, respectively, as input data. The clock $CK_3$ input into the timing generator 102 is output from the timing generator 102 as a reset pulse $CK_5$, and the output reset pulse $CK_5$ is further input into the counters 103 and 104, respectively, as reset pulses.

The counter 103 counts, during pulse interval of the reset pulse $CK_5$, leading edges of the pulse of the clock $CK_4$ which is input data, and the counted pulse number $S_{up}$ is output. The counter 104 counts, during pulse interval of the reset pulse $CK_5$, leading edges of the pulse of the clock $CK_4$ which is input data, and the counted pulse number $S_{down}$ is output.

The pulse numbers $S_{up}$ and $S_{down}$ respectively output from the counters 103 and 104 are input into an adder 105. In the adder 105, the pulse number $S_{up}$ is added to the pulse number $S_{down}$, and the number of state change during pulse interval of the clock $CK_4$ of the reset pulse $CK_5$, i.e., an addition value $N_1$ which is the number of pulse rising and falling edges of the pulse is output.

The addition value $N_1$ from output the adder 105 is input into a comparator 106 as input data B and to a comparator 107 as input data A. A reference value $N_2$ is further input into the comparator 107 as input data B, and the input data A is compared with the input data B to judge whether a relation A<B is satisfied. That is, the comparator 107 judges whether a relation of $N_1 < N_2$ is satisfied, and if the relation of $N_1 < N_2$ is satisfied, an error signal $E_2$ is output from the comparator 107.

Here, the reference value $N_2$ is an arbitrary natural number satisfying a relation of $N_2 \cdot f_3 < 2 \cdot f_4 \leq (N_2+1) \cdot f_3$. $N_2+1$ is input into the comparator 106 as input data A, and like the comparator 107, the input data A is compared with the data B to judge whether a relation of A<B is satisfied. That is, the comparator 106 judges whether a relation of $N_1 > N_2+1$ is satisfied. If the relation $N_1 > N_2+1$ is satisfied, an error signal $E_1$ is output from the comparator 106.

Since the pulse interval of the reset pulse $CK_5$ is determined by the frequency $f_3$ of the clock $CK_3$, a relation of $N_1 \leq N_2+1$ is established with respect to the reference value $N_2$ satisfying the relation $N_2 \cdot f_3 \leq 2 \cdot f_4 < (N_2+1) \cdot f_3$ in the clock $CK_4$ (frequency $f_4$) and the reset pulse $CK_5$ (frequency $f_3$) respectively input into the counters 103 and 104. Therefore, when a relation $N_1 > N_2+1$ is satisfied in the comparator 106, this means that the frequency $f_4$ of the $CK_4$ is higher than its original frequency or the frequency $f_3$ of the $CK_3$ is lower than its original frequency, and an error signal $E_1$ is output from the comparator 106.

If a relation $N_1 < N_2$ is satisfied in the comparator 107, this means that the frequency $f_4$ of the $CK_4$ is lower than its original frequency or the frequency $f_3$ of the $CK_3$ is higher than its original frequency, and an error signals $E_2$ are output from the comparator 107.

The error signals $E_1$ and $E_2$ respectively output from the comparators 106 and 107 are input into a judging device 108 together with a timing pulse TP output from the timing generator 102, and an error flag EF indicative of abnormal clock $CK_1$ or $CK_2$ is output from the judging device 108.

As explained above, according to the conventional abnormal clock detecting apparatus, frequencies of two different clocks to be detected are divided, the rising and falling edges of the clocks divided by the two counters are counted, the counted results are added by the adder, the addition result and the reference value are compared with each other by the comparator, thereby detecting the abnormal clock.

In the conventional abnormal clock detector, however, the adder, comparator for calculating the counted values by the counter, and the timing generator for generating the reset pulse and timing pulse are required, which complicates the circuit structure of the detector.

Especially in the case of the abnormal clock detector disclosed in Japanese Patent Application Laid-open No. 4-306930, it is not possible to specify one of two clocks to be detected, and this circuit structure can not detect abnormal condition of three or more clocks.

Therefore, it is an object of the present invention to provide an abnormal clock detector and an abnormal clock detecting apparatus capable of detecting abnormal condition of three or more different clocks with a simple circuit structure.

DISCLOSURE OF THE INVENTION

An abnormal clock detector of the present invention for detecting an abnormality of frequency of a first and second clock signals which are used as input signals, comprises: a first frequency divider circuit for dividing frequency of the first clock signal to output a first frequency division clock signal, a second frequency divider circuit for dividing frequency of the first clock signal to output a first reset signal, a third frequency divider circuit for dividing frequency of the second clock signal to output a second frequency division clock signal, a fourth frequency divider circuit for dividing frequency of the second clock signal to output a second reset signal, a first clock comparison circuit which inputs the first frequency division clock signal and the second reset signal, which counts the number of pulses of the first frequency division clock signal based on a state of the second reset signal, and which outputs a first error signal indicative of a clock abnormal state when the counted number of pulses exceeds a predetermined value; and a second clock comparison circuit which inputs the second frequency division clock signal and the first reset signal, which counts the number of pulses of the second frequency division clock signal based on a state of the first reset signal, and which outputs a second error signal indicative of a clock abnormal state when the counted number of pulses exceeds a predetermined value.

According to the present invention, it is possible to detect a higher state having frequency higher than original normal frequency, a lower state having frequency lower than original normal frequency and a stopped state of the two clocks to be detected only by the clock comparator and the frequency divider circuit without requiring complicated circuit as compared with the conventional abnormal clock detector.

A abnormal clock detector of the next invention, each of the first and second comparison circuits comprises an inverter gate for inverting a state of the first or second reset signal, a first shift register comprising at least two stage flip-flops which inputs the first or second frequency division clock signal as a clock input, which inputs the first or second reset signal as a reset input, and which outputs a first output signal, a second shift register which inputs the first or second frequency division clock signal as a clock input, which inputs the first or second reset signal inverted by the inverter gate as a reset input, and which outputs a second output signal, and an OR gate for carrying out logical OR calculation of the first and second output signals to output the first or second error signal.

According to this invention, the clock comparator only comprises a shift register, an inverter gate and an OR gate, and an abnormal clock is judged utilizing a shaft of data in the shift register. Therefore, the judgment of abnormal clock can be made with a simple structure without using a special comparison operator circuit.

According to abnormal clock detector of the next invention, in the first and second shift registers, data input of the first flip-flop is fixed to a "H" level.

According to this invention, the data input used in the shift register is fixed at "H" level, and the shift of data is utilized, thereby judging abnormal clock. Therefore, the judgment of abnormal clock can be made with a simple structure without requiring a special data signal necessary for the shift register.

A abnormal clock detector of the next invention comprises: at least three clock signals, abnormal clock detectors as many as the number of combinations capable of comparing the at least three clock signals, and an abnormal clock judging circuit for outputting clock judging signals indicative of abnormal clock when each clock signal is abnormal to the at least three clock signals based on an error signal output from each of the abnormal clock detectors.

According to this invention, it is possible to detect a higher state having frequency higher than original normal frequency, a lower state having frequency lower than original normal frequency and a stopped state of the three or more clocks to be detected, and to specify which one of the three or more clocks is abnormal.

BEST MODE FOR CARRYING OUT THE INVENTION

Embodiments of an abnormal clock detector and an abnormal clock detecting apparatus according to the present invention will be explained in detail based on the drawings. The invention is not limited to the embodiments.

Figure 1:
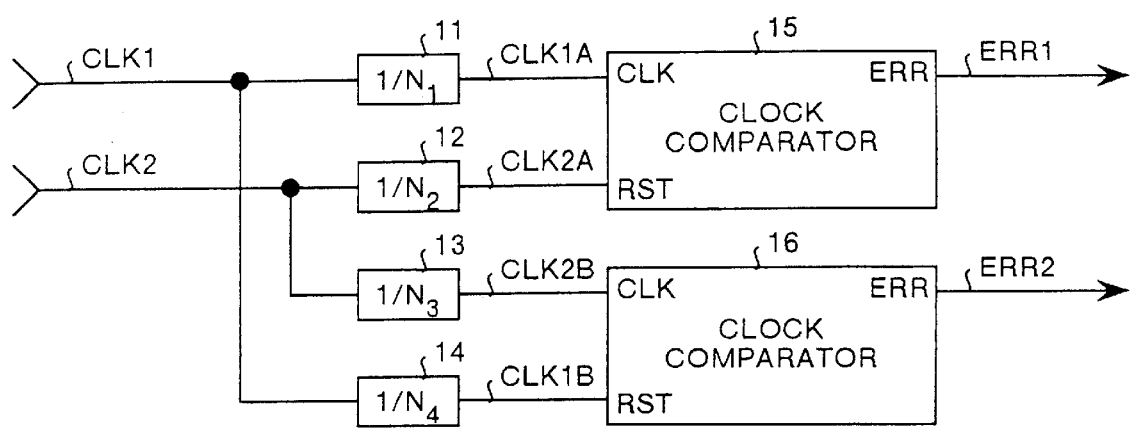
FIG. 1 is a block diagram of an abnormal clock detector in a first embodiment of the present invention.

FIG. 1 is a block diagram of an abnormal clock detector in a first embodiment of the invention. As shown in FIG. 1, clocks CLK1 and clock CLK2 are used for information processing apparatus, and they having different duty ratio of oscillation frequency. Abnormal clock out of the clocks CLK1 and CLK2 is detected by the abnormal clock detector.

As shown in FIG. 1, the clock CLK1 is input into a frequency divider circuits 11 and 14. The clock CLK2 is input into frequency divider circuits 12 and 13. The frequency divider circuits 11, 12, 13 and 14 are frequency circuits for dividing frequencies of input clocks by frequency division ratio $N_1$, $N_2$, $N_3$ and $N_4$. Frequency of the clock CLK1 input into the frequency divider circuit 11 is divided by the frequency division ratio $N_1$ and output as a clock CLK1A.

Frequency of the clock CLK2 input into the frequency divider circuit 12 is divided by the frequency division ratio $N_2$ and output as a clock CLK2A. Frequency of the clock CLK2 input into the frequency divider circuit 13 is divided by the frequency division ratio $N_3$ and output as a clock CLK2B. Frequency of the clock CLK1 input into the frequency divider circuit 14 is divided by the frequency division ratio $N_4$ and output as a clock CLK1B.

The clock CLK1A output from the frequency divider circuit 11 and the clock CLK2A output from the frequency divider circuit 12 are input in a clock comparator (clock comparison circuit) 15 as CLK input and RST input. The clock comparator 15 activate an ERR output and outputs an error signal ERR1 when frequency of clock CLK1A becomes higher than a certain judging value, i.e., when the clock CLK1 becomes higher than its original frequency, or when frequency of the clock CLK2A becomes lower than the certain judging value, i.e., when the clock CLK2 becomes lower than its original frequency.

The clock CLK2B output from the frequency divider circuit 13 and the clock CLK1B output from the frequency divider circuit 14 are input in a clock comparator (clock comparison circuit) 16 as CLK input and RST input. The clock comparator 16 activate an ERR output and outputs an error signal ERR2 when frequency of clock CLK2B becomes higher than a certain judging value, i.e., when the clock CLK2 becomes higher than its original frequency, or when frequency of the clock CLK1B becomes lower than the certain judging value, i.e., when the clock CLK1 becomes lower than its original frequency.

Figure 2:
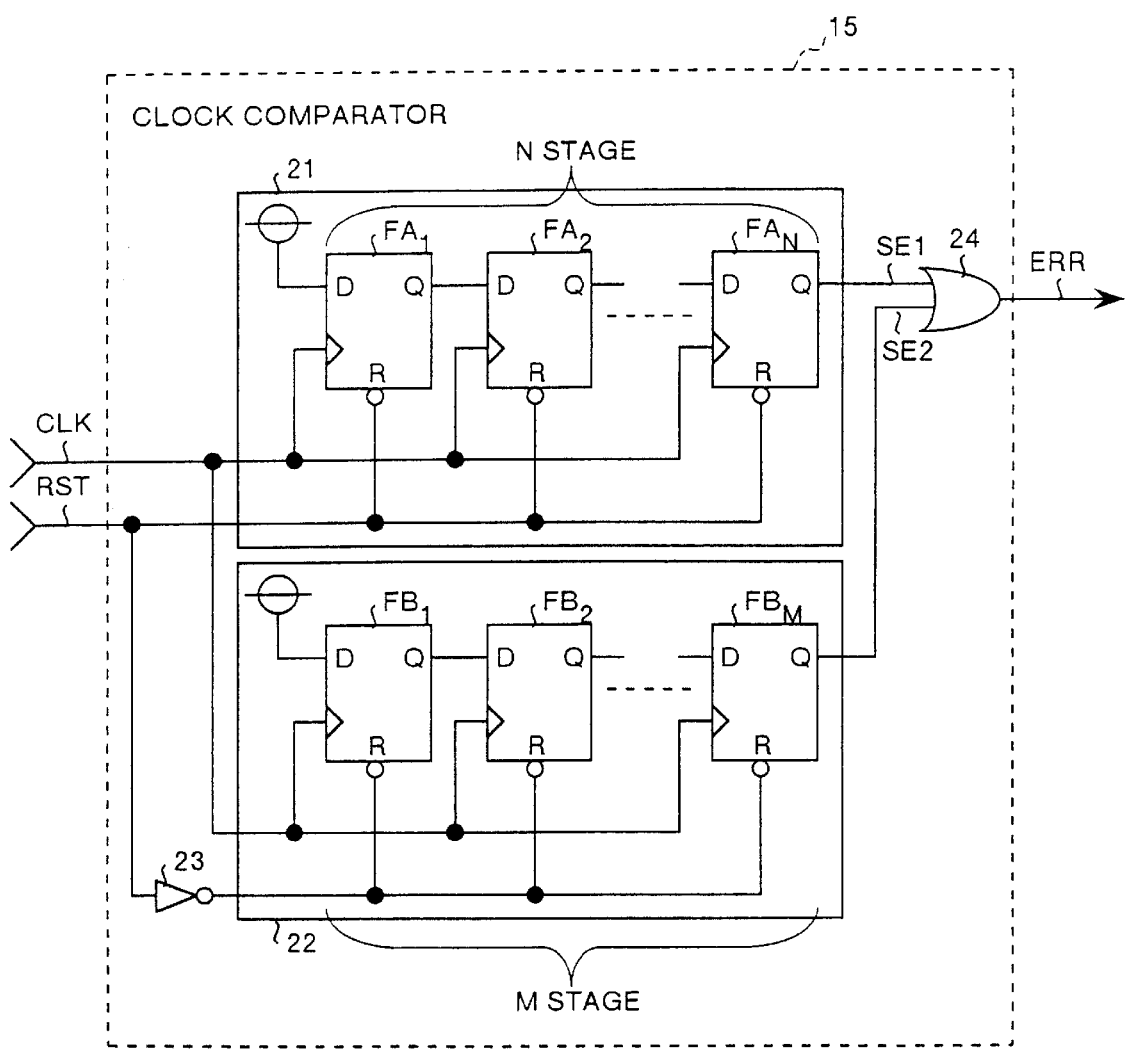
FIG. 2 is a diagram showing an internal structure of a clock comparator shown in FIG. 1.

FIG. 2 is a diagram showing an internal structure of the clock comparator 15 shown in FIG. 1. The internal structure of the comparator 16 shown in FIG. 1 is the same as that of the clock comparator 15 shown in FIG. 2.

As shown in FIG. 2, the clock comparator 15 comprises an N-stage shift register 21 and an M-stage shift register 22, an inverter gate 23 and an OR gate 24. A signal input as the CLK input (in this case, clock CLK1A) is input into the shift register 21 and the shift register 22 as clock input. A signal input as RST input (in this case, clock CLK2A) is input into the shift register 21 as a reset input, and input into the shift register 22 through the inverter gate 23 as a reset input.

A high logical level (hereafter, "H" level) signal is always input into the shift register 21 as input data. That is, D input of a first flip-flop $FA_1$ is "H" level. N-number of flip-flop $FA_1$ to $FA_N$ input into R input signals inverted with respect to signals input into the RST input as reset inputs. Thus, the flip-flop $FA_1$ to $FA_N$ are reset when signal input into the RST input is low logical level (hereafter, "L" level), and set Q output to "L" level.

That is, in the flip-flop $FA_1$ to $FA_N$, as long as the signal input into the RST input is "H" level, the input data ("H" level) is synchronized by the CLK input and input into the D input of flip-flop sequentially, and Q output of the N-th flip-flop $FA_N$ is output as an output signal SE1 of the shift register 21.

In this case, for a time period during which the clock CLK2A input into the RST input is held at "H" level, the rising edges of the clock CLK1A input into the CLK input is generated N times, and the output signal SE1 of the shift register 21 shows "H" level.

The shift register 22 has the same structure as that of the shift register 21 except that M-number of flip-flip $FB_1$ to $FB_M$ are used instead of the N-number of flip-flip $FA_1$ to $FA_N$. However, the level of a signal input into the RST input is inverted in the inverter gate 23 and is further inverted in R input. Thus the flip-flip $FB_1$ to $FB_M$ are reset when the signal input into the RST input is "H" level, and set each Q output to "L" level.

That is, in the flip-flop $FB_1$ to $FB_M$, as long as the signal input into the RST input is "L" level, the input data ("H" level) is synchronized by the CLK input and input into the D input of flip-flop sequentially, and Q output of the M-th flip-flop $FB_M$ is output as an output signal SE2 of the shift register 22.

In this case, for a time period during which the clock CLK2A input into the RST input is held at "L" level, the rising edges of the clock CLK1A input into the CLK input is generated M times, and the output signal SE2 of the shift register 22 shows "H" level.

The output signals SE1 and SE2 respectively output in the shift registers 21 and 22 are input into an OR gate 24. In the OR gate 24, a logical OR of the output signals SE1 and SE2 is calculated, and an error signal ERR is output.

Here, it is necessary to previously set the frequency division ratio $N_1$, $N_2$, $N_3$ and $N_4$ shown n FIG. 1, and the N-, and M-number of shift registers in the clock comparators 15 and 16 as natural numbers while taking into consideration the frequencies of the clock CLK1 and the clock CLK2, the duty ratio, the frequency precision and abnormal clock detection precision so that the ERR signal of the clock comparator output to the normal clocks (CLK1, CLK2) is not activated, i.e., does not become "H" level.

For example, in the shift register 21 of the clock comparator 15, the N-number is set such that the clock CLK2A becomes smaller than the rising edge number of the clock CLK1A for a time period during which "H" level is held with respect to the normal clocks CLK1A and CLK2A.

Further, if each of the N-number and M-number of the shift registers 21 and 22 is one, since the clocks CLK1 and CLK2 to be detected are generally asynchronous, even if the clocks CLK1 and CLK2 are normal, the ERR signal output in each clock comparator is activated, i.e., becomes "H" level. Therefore, it is necessary to set each of the N-number and M-number to two or greater.

The N-number and M-number used in the clock comparators 15 and 16 need not be the same with each other and their design may be changed appropriately.

Therefore, with respect to the clock CLK1A and the clock CLK2A input into the clock comparator 15, the error signal ERR1 output from the clock comparator 15 is activated, i.e., shows "H" level when the following two conditions are satisfied, and it is detected that one of the clocks CLK1 or CLK2 is abnormal.

Condition 1: The frequency of the clock CLK1 becomes higher than its original normal frequency for a time period during which the clock CLK2A is held at "H" level, and the rising edges of the clock CLK1A occurs N-times or more (detection in shift register 21), or frequency of the clock CLK1 becomes higher than its original normal frequency for a time period during which the clock CLK2A is held at "L" level, and the rising edges of the clock CLK1A occurs M-times or more (detection in shift register 22).

Condition 2: The frequency of the clock CLK2 becomes lower than its original normal frequency (including a case in which the oscillation of the clock CLK2 stops "H" level or "L" level), the rising edge of the clock CLK1A occurs N-times or more (detection in shift register 21) for a time period during which the clock CLK2A is held at "H" level which became longer than its original length, or the frequency of the clock CLK2 becomes lower than its original normal frequency and the rising edge of the clock CLK1A occurs M-times for a time period during which the clock CLK2A is held at "L" level which became longer than its original length (detection in shift register 22).

With respect to the clock CLK2B and the clock CLK1B input into the clock comparator 16, the error signal ERR2 output from the clock comparator 16 is activated, i.e., shows "H" level when the following two conditions are satisfied, and it is detected that one of the clocks CLK1 or CLK2 is abnormal.

Condition 1: The frequency of the clock CLK2 becomes higher than its original normal frequency for a time period during which the clock CLK1B is held at "H" level, and the rising edges of the clock CLK2B occurs N-times or more (detection in shift register 21), or frequency of the clock CLK2 becomes higher than its original normal frequency for a time period during which the clock CLK1B is held at "L" level, and the rising edges of the clock CLK2B occurs M-times or more (detection in shift register 22).

Condition 2: The frequency of the clock CLK1 becomes lower than its original normal frequency (including a case in which the oscillation of the clock CLK1 stops "H" level or "L" level), the rising edge of the clock CLK2B occurs N-times or more (detection in shift register 21) for a time period during which the clock CLK1B is held at "H" level which became longer than its original length, or the frequency of the clock CLK1 becomes lower than its original normal frequency and the rising edge of the clock CLK2B occurs M-times for a time period during which the clock CLK1B is held at "L" level which became longer than its original length (detection in shift register 22).

For example, it is assumed that the clock CLK1 is 10 MHz (duty ratio is 50%), the clock CLK2 is 40 MHz (duty ratio is 50%), a frequency division ratio $N_1$ in the frequency divider circuit 11 is 1, a frequency division ratio $N_2$ in the frequency divider circuit 12 is 4, a frequency division ratio $N_3$ in the frequency divider circuit 13 is 4, a frequency division ratio $N_4$ in the frequency divider circuit 14 is 1, the number of shift registers in each of the clock comparators 15 and 16 is 2 (N=2, M=2). The clock CLK1 and the clock CLK2 are asynchronous with each other. To facilitate the understanding of the invention, it is assumed that both the set-up time and hold time of the flip-flop used in the shift register are 0s.

Figure 3:
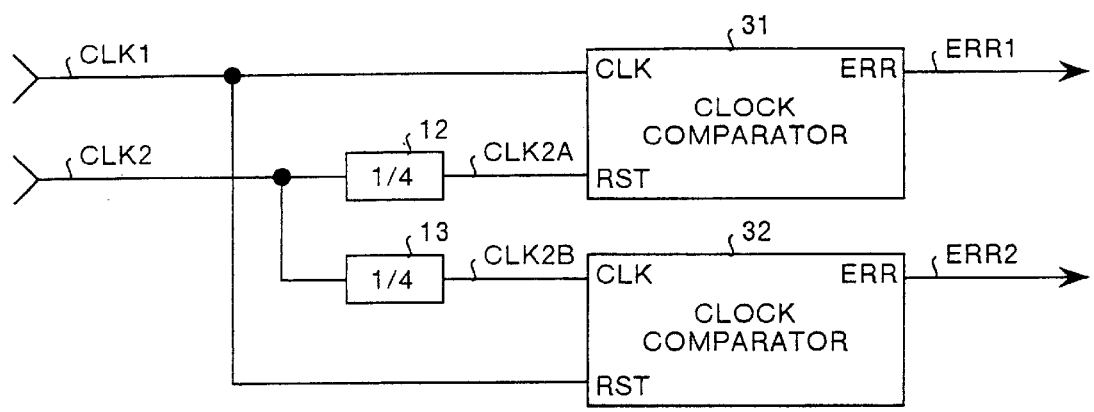
FIG. 3 is a block diagram of an abnormal clock detector in the first embodiment of the invention.

FIG. 3 is a block diagram of the abnormal clock detector in the above conditions. FIG. 3 is different from FIG. 1 in that both the frequency division ratios of the frequency divider circuit 11 and the frequency divider circuit 14 are 1 and thus, descriptions of the frequency divider circuit 11 and the frequency divider circuit 14 are omitted, and the clock CLK1 (10 MHz) is input, as it is, to the CLK input of a clock comparator (clock comparison circuit) 31 and RST input of a clock comparator (clock comparison circuit) 32. The frequency of the clock CLK2 (40 MHz) is divided by a frequency division ration 4 in both the frequency divider circuits 12 and 13, and the divided frequencies are input into the RST input of the clock comparator 31 and the CLK input of the clock comparator 32 as the clock CLK2A (10 MHz, duty ratio of 50%) and the clock CLK2B (10 MHz, duty ratio of 50%).

Figure 4:
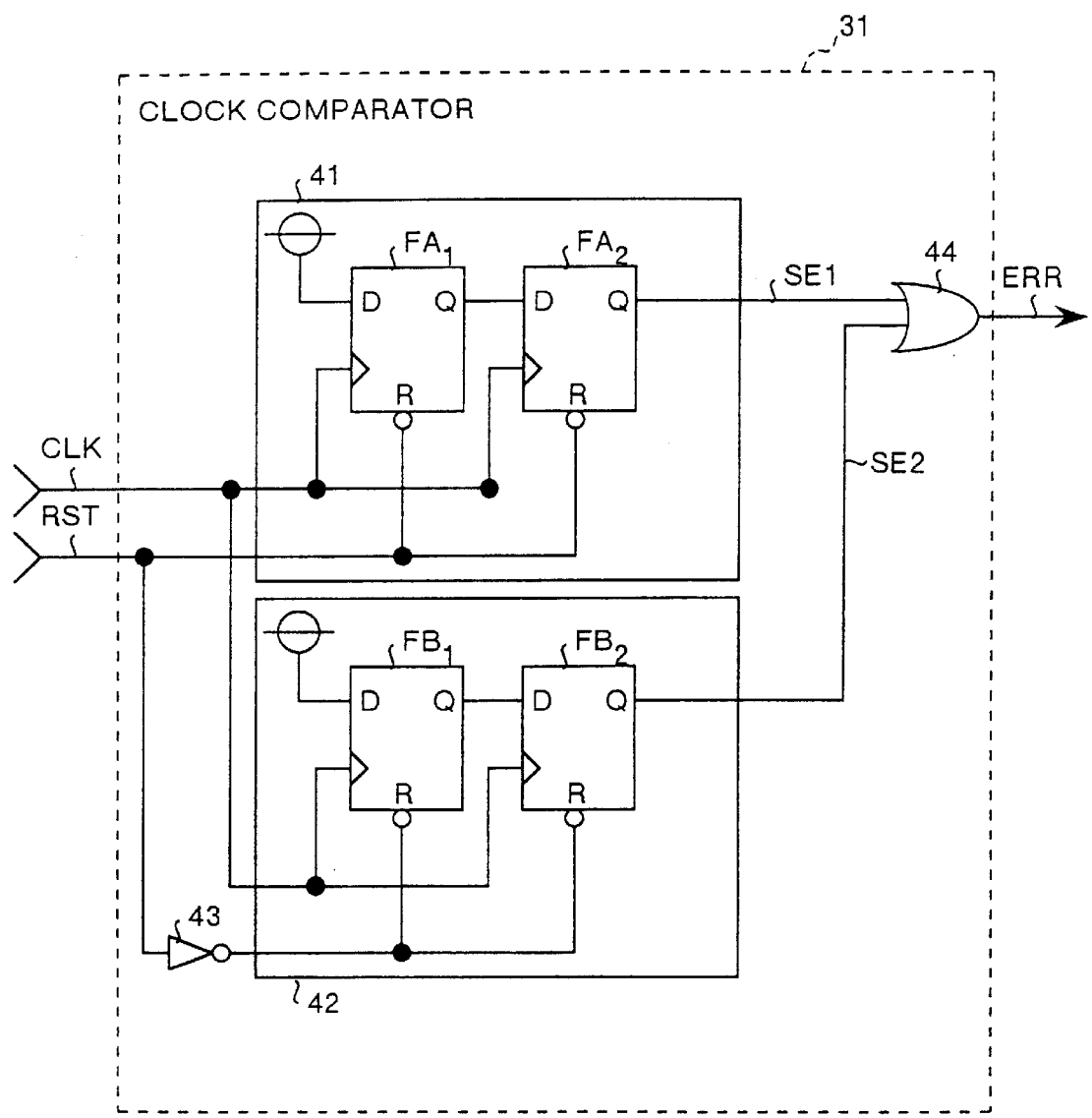
FIG. 4 is a diagram showing an internal structure of a clock comparator shown in FIG. 3.

FIG. 4 is a diagram showing an internal structure of the clock comparator 31 shown in FIG. 3. The internal structure of the clock comparator 32 shown in FIG. 3 is the same as that of the clock comparator 31 shown in FIG. 3, and is different from FIG. 2 in that shift registers 41 and 42 in which both the N-number and M-number are set to 2 are used.

Therefore, in the clock comparator shown in FIG. 4, if the rising edges of clock input into the CLK was counted twice or more during each period when a signal input into the RST input is held at "H" level or "L" level, the error signal ERR is set to "H" level.

Operation of the abnormal clock detector shown in FIG. 3 will be explained here. FIG. 5 to FIG. 13 are timing charts of the clocks CLK1, CLK2, CLK2A, CLK2B, error signals ERR1 and ERR2.

Figure 5:
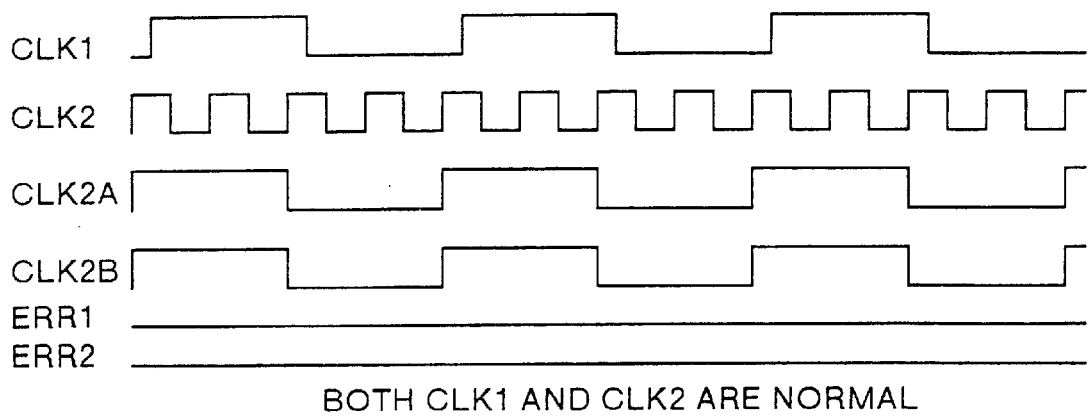
FIG. 5 is a timing chart showing the operation of the abnormal clock detector shown in FIG. 3.

First, FIG. 5 is a timing chart when both the clocks CLK1 and CLK2 are normal. In FIG. 5, the rising edge of the clock CLK1 is not counted twice or more for a time period during which the clock CLK2A is held at "H" level (detection in shift register 41 of clock comparator 31). The rising edge of the clock CLK1 is not counted twice or more neither for a time period during which the clock CLK2A is held at "L" level (detection in shift register 42 of clock comparator 31).

The rising edge of the clock CLK2B is not counted twice or more for a time period during which the clock CLK1 is held at "H" level (detection in shift register 42 of clock comparator 32). The rising edge of the clock CLK2B is not counted twice or more neither for a time period during which the clock CLK1 is held at "L" level (detection in shift register 42 of clock comparator 32).

Therefore, the output signal SE1 and SE2 respectively output from the shift registers 41 and 42 in the clock comparators 31 and 32 both show "L" level and thus, the error signals ERR1 and ERR2 also both show "L" level through an OR gate 44 and thus, it is not judged that the clocks CLK1 and CLK2 are abnormal.

Figure 6:
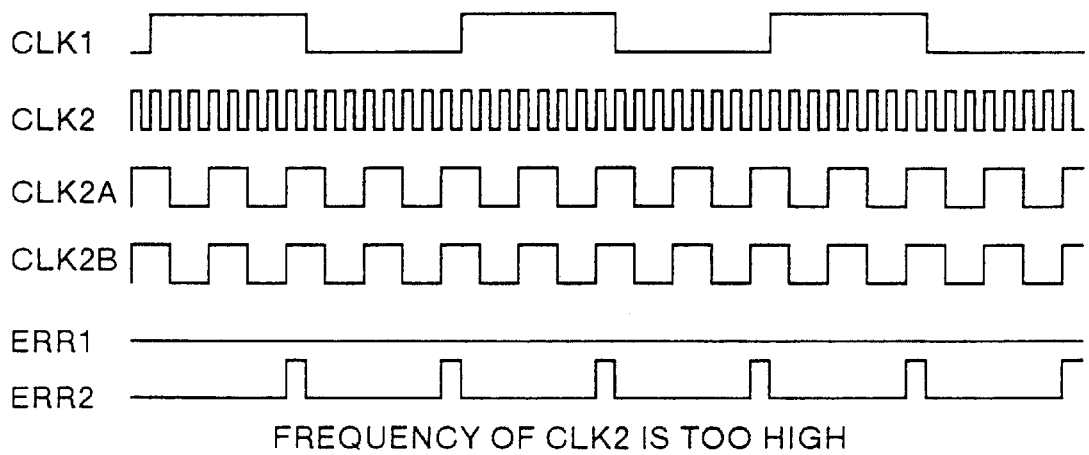
FIG. 6 is a timing chart showing the operation of the abnormal clock detector shown in FIG. 3.

FIG. 6 is a timing chart when the clock CLK2 has frequency higher than its original normal frequency. In FIG. 6, the rising edge of the clock CLK1 is not counted twice or more for a time period during which the clock CLK2A is held at "H" level (detection in shift register 41 of clock comparator 31). The rising edge of the clock CLK1 is not counted twice or more neither for a time period during which the clock CLK2A is held at "L" level (detection in shift register 42 of clock comparator 31).

However, the rising edge of the clock CLK2B is counted twice or more for a time period during which the clock CLK1 is held at "H" level (detection in shift register 41 of clock comparator 32), and the rising edge of the clock CLK2B is also counted twice or more for a time period during which the clock CLK1 is held at "L" level (detection in shift register 42 of clock comparator 32).

Therefore, the output signal SE1 and SE2 respectively output from the shift registers 41 and 42 in the clock comparator 31 both show "L" level, "L" level is indicated for the error signal ERR1 through the OR gate 44, the output signal SE1 and SE2 respectively output from the shift registers 41 and 42 in the clock comparator 32 both show "H" level, "H" level is indicated for the error signal ERR2 through the OR gate 44.

That is, it is judged that the clock CLK2 is abnormal. As shown in the timing chart of the error signal ERR2 in FIG. 6, the "H" level state of the error signal ERR2 is maintained until the level of the clock CLK1 is changed, i.e., until the next falling or rising edge is generated. The pulse of the error signal ERR2 indicative of this "H" level is repeatedly generated until the clock CLK2 is restored to its normal condition.

Figure 7:
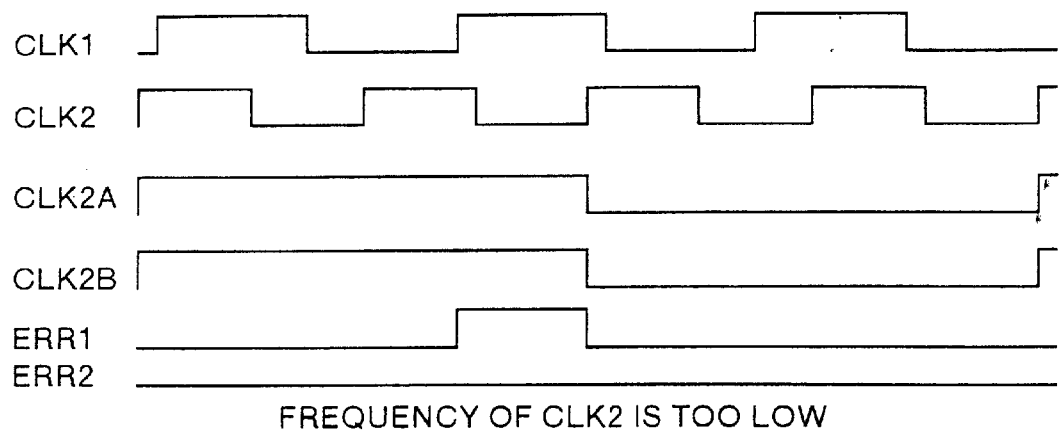
FIG. 7 is a timing chart showing the operation of the abnormal clock detector shown in FIG. 3.

FIG. 7 is a timing chart when the clock CLK2 has frequency lower than its original normal frequency. In FIG. 7, the rising edge of the clock CLK2B is not counted twice or more for a time period during which the clock CLK1 is held at "H" level (detection in shift register 41 of clock comparator 32). The rising edge of the clock CLK2B is not counted twice or more neither for a time period during which the clock CLK1 is held at "L" level (detection in shift register 42 of clock comparator 31).

However, the rising edge of the clock CLK1 is counted twice or more for a time period during which the clock CLK2A is held at "H" level (detection in shift register 41 of clock comparator 31), and the rising edge of the clock CLK1 is also counted twice or more for a time period during which the clock CLK2A is held at "L" level (detection in shift register 42 of clock comparator 31).

Therefore, the output signal SE1 and SE2 respectively output from the shift registers 41 and 42 in the clock comparator 32 both show "L" level, "L" level is indicated for the error signal ERR2 through the OR gate 44, the output signal SE1 and SE2 respectively output from the shift registers 41 and 42 in the clock comparator 31 both show "H" level, "H" level is indicated for the error signal ERR1 through the OR gate 44.

That is, it is judged that the clock CLK2 is abnormal. As shown in the timing chart of the error signal ERR1 in FIG. 7, the "H" level state of the error signal ERR1 is maintained until the level of the clock CLK2A is changed, i.e., until the next falling or rising edge is generated. The pulse of the error signal ERR2 indicative of this "H" level is repeatedly generated until the clock CLK2 is restored to its normal condition.

Figure 8:
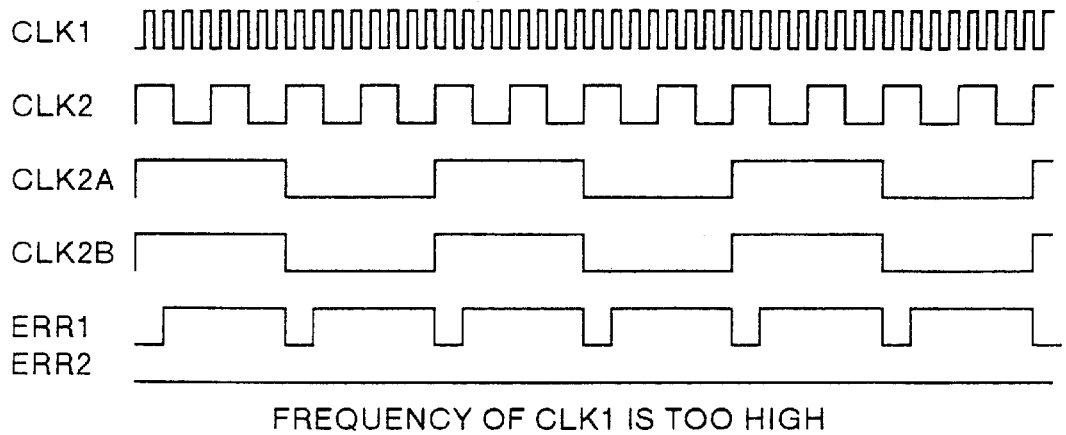
FIG. 8 is a timing chart showing the operation of the abnormal clock detector shown in FIG. 3.

FIG. 8 is a timing chart when the clock CLK1 has frequency higher than its original normal frequency. This case can be considered in the same manner as a case in which the clock CLK2 shown in FIG. 7 has frequency lower than its original normal frequency.

Therefore, although the error signal ERR2 shows "L" level, the error signal ERR1 shows "H" level. That is, it is judged that the clock CLK1 is abnormal. As shown in the timing chart of the error signal ERR1 in FIG. 8, the "H" level state of the error signal ERR1 is maintained until the level of the clock CLK2A is changed, i.e., until the next falling or rising edge is generated. The pulse of the error signal ERR2 indicative of this "H" level is repeatedly generated until the clock CLK1 is restored to its normal condition.

Figure 9:
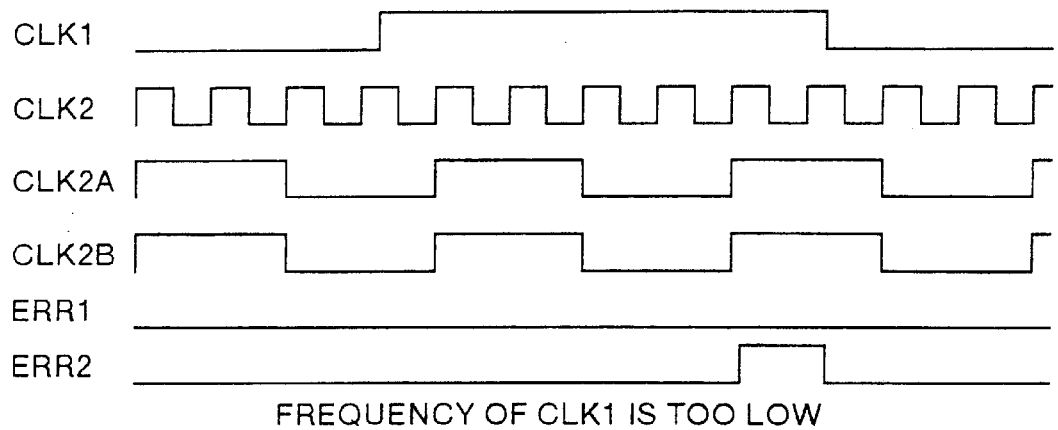
FIG. 9 is a timing chart showing the operation of the abnormal clock detector shown in FIG. 3.

FIG. 9 is a timing chart when the clock CLK1 has frequency lower than its original normal frequency. This case can be considered in the same manner as a case in which the clock CLK2 shown in FIG. 6 has frequency higher than its original normal frequency.

Therefore, although the error signal ERR1 shows "L" level, the error signal ERR2 shows "H" level. That is, it is judged that the clock CLK1 is abnormal. As shown in the timing chart of the error signal ERR2 in FIG. 9, the "H" level state of the error signal ERR2 is maintained until the level of the clock CLK1 is changed, i.e., until the next falling or rising edge is generated. The pulse of the error signal ERR2 indicative of this "H" level is repeatedly generated until the clock CLK1 is restored to its normal condition.

Figure 10:
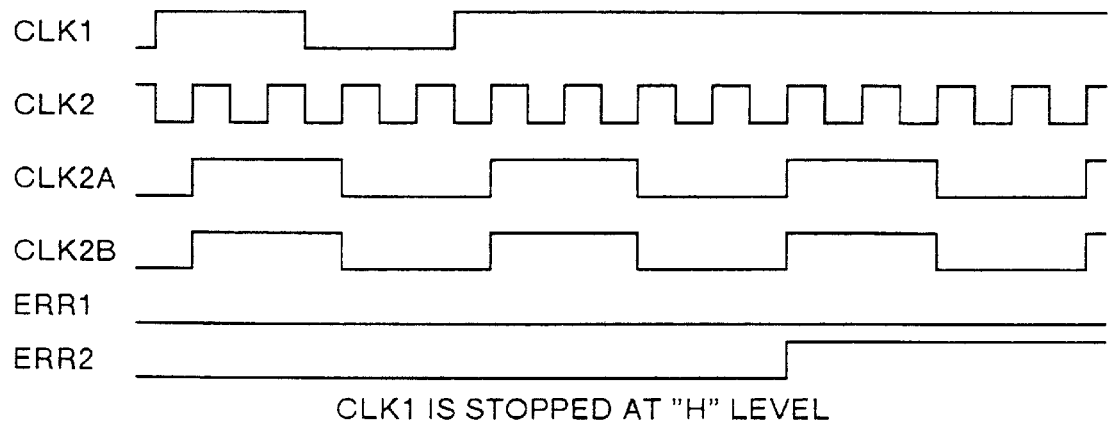
FIG. 10 is a timing chart showing the operation of the abnormal clock detector shown in FIG. 3.
Figure 11:
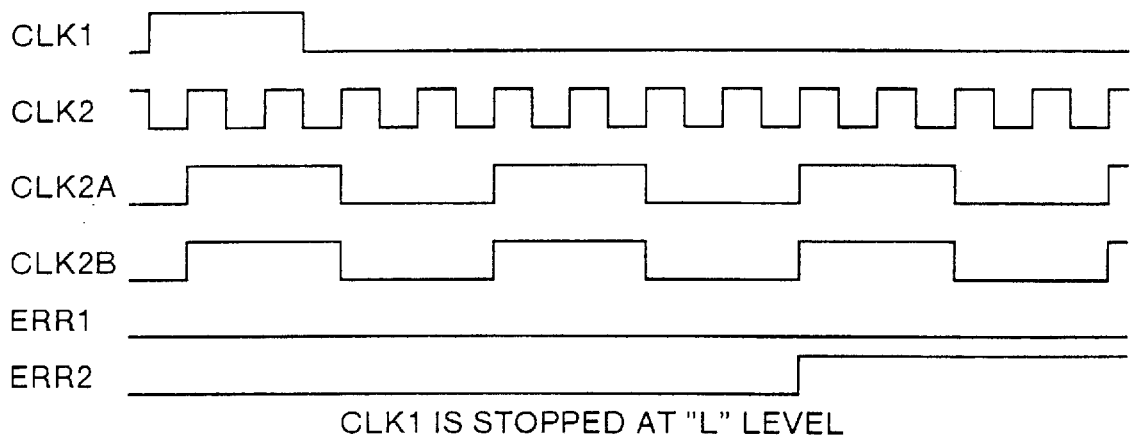
FIG. 11 is a timing chart showing the operation of the abnormal clock detector shown in FIG. 3.

FIG. 10 is a timing chart when the clock CLK1 stopped at "H" level, and FIG. 11 is a timing chart when the clock CLK1 stopped at "L" level. This case can be considered in the same manner as a case in which the clock CLK2 shown in FIG. 6 has frequency higher than its original normal frequency.

Therefore, although the error signal ERR1 shows "L" level, the error signal ERR2 shows "H" level. That is, it is judged that the clock CLK1 is abnormal. The "H" level state of the error signal ERR2 is maintained until the clock CLK1 is restored to its normal condition.

Figure 12:
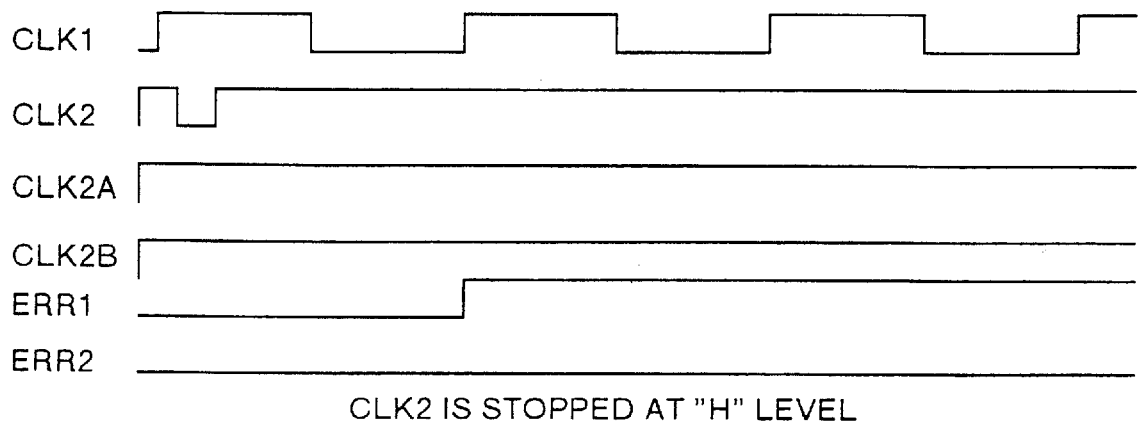
FIG. 12 is a timing chart showing the operation of the abnormal clock detector shown in FIG. 3.
Figure 13:
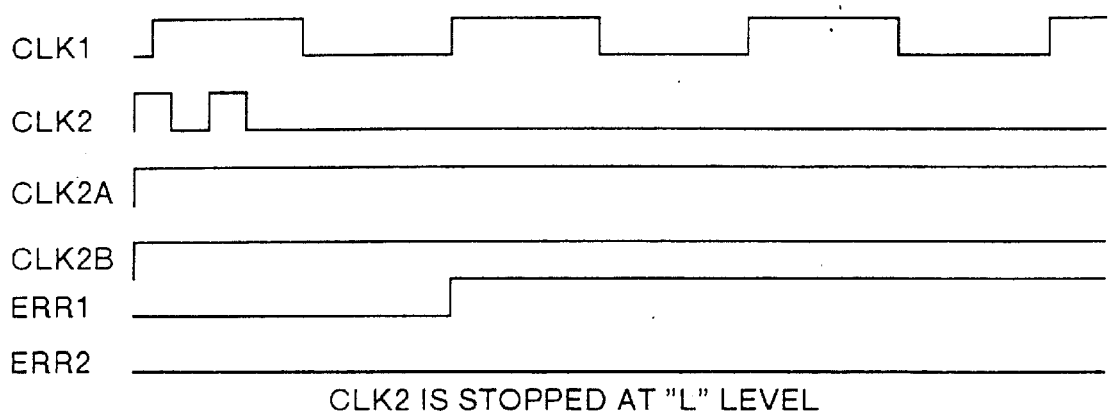
FIG. 13 is a timing chart showing the operation of the abnormal clock detector shown in FIG. 3.

FIG. 12 is a timing chart when the clock CLK2 stopped at "H" level, and FIG. 13 is a timing chart when the clock CLK2 stopped at "L" level. This case can be considered in the same manner as a case in which the clock CLK2 shown in FIG. 7 has frequency lower than its original normal frequency.

Therefore, although the error signal ERR2 shows "L" level, the error signal ERR1 shows "H" level. That is, it is judged that the clock CLK2 is abnormal. The "H" level state of the error signal ERR1 is maintained until the clock CLK2 is restored to its normal condition.

As explained above, according to the abnormal clock detector of the first embodiment, it is possible to detect a higher state having frequency higher than original normal frequency, a lower state having frequency lower than original normal frequency and a stopped state of the two clocks to be detected only by the clock comparator having resister and logic gate and the frequency divider circuit without requiring complicated circuit as compared with the conventional abnormal clock detector.

Further, since the clock comparator of the first embodiment detects the abnormal clock based on the maintaining period of "H" level or "L" level of the clock, it is possible to detect the abnormal clock even if the clock does not have its original normal duty ratio.

Figure 14:
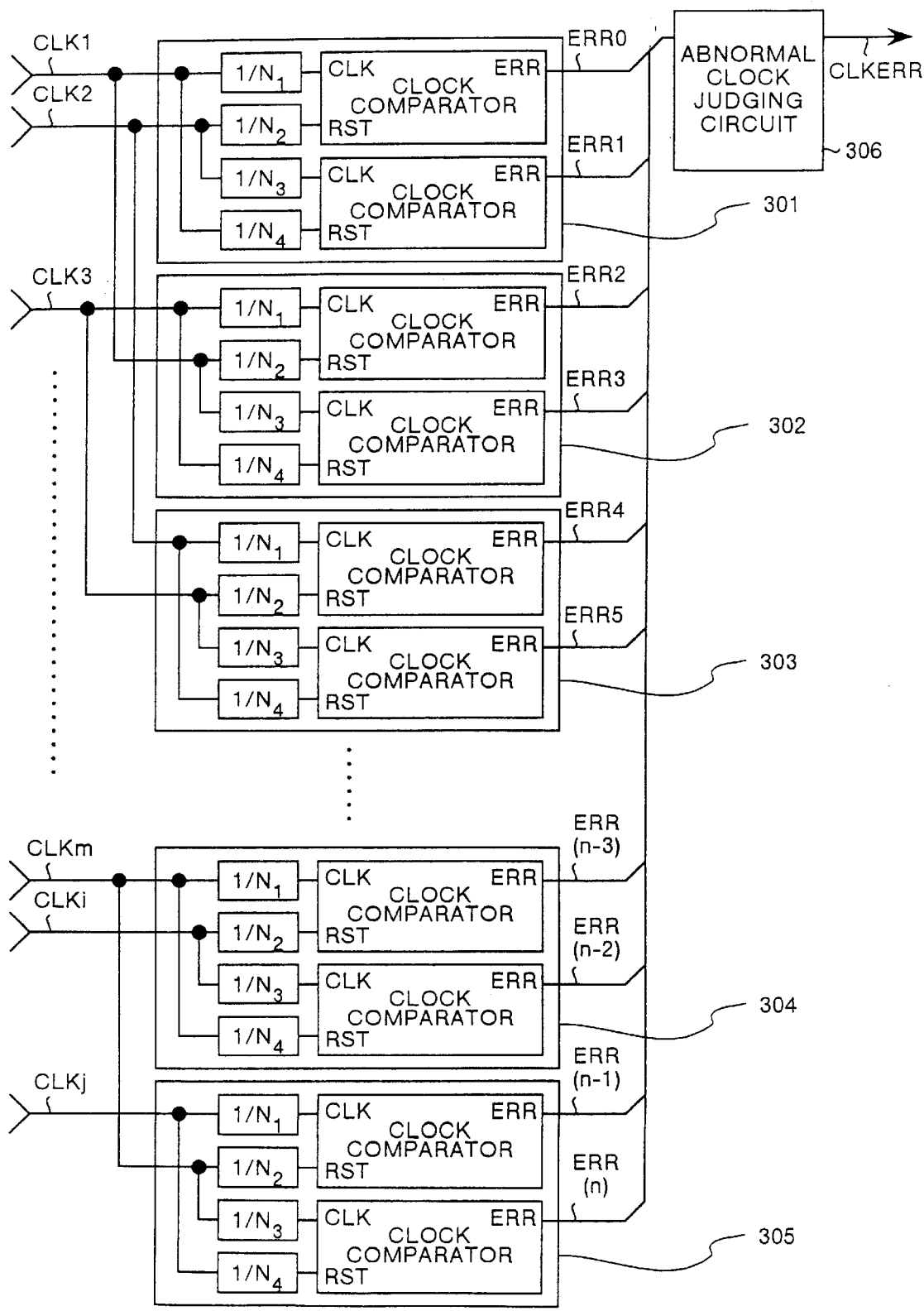
FIG. 14 is a block diagram of an abnormal clock detecting apparatus in a second embodiment of the invention.

FIG. 14 is a block diagram of an abnormal clock detecting apparatus in a second embodiment of the invention. The abnormal clock detecting apparatus of the second embodiment shown in FIG. 14 uses at least three abnormal clock detectors of the first embodiment, thereby precisely judging which clock is abnormal. Here, the abnormal clock detector of the above-described first embodiment is called as abnormal clock detecting section.

FIG. 14 shows an abnormal clock detecting apparatus when abnormal condition is detected with respect to m-number of clocks. First, the clocks CLK1 and CLK2 are input into an abnormal clock detecting section 301. As explained in the first embodiment, abnormal conditions of the clocks CLK1 and CLK2 input into the abnormal clock detecting section 301 are detected, and error signals ERR0 and ERR1 are output from the abnormal clock detecting section 301.

Similarly, the clocks CLK1 and CLK3 are input into an abnormal clock detecting section 302, and the clocks CLK2 and CLK3 are input into an abnormal clock detecting section 303. Error signals ERR2 and ERR3 and error signal ERR4 and ERR5 are output from the abnormal clock detecting sections 302 and 303. Therefore, with respect to the three clocks CLK1, CLK2 and CLK3, two error signals can be obtained for each of all possible combinations (CLK1, CLK2), (CLK1, CLK3) and (CLK2, CLK3) which are compared with each other.

If a fourth clock CLK4 (not shown) is added as a subject to be detected, this clock is added to the three combination, it is necessary to prepare total six abnormal clock detecting sections for each of the clock CLK4 itself and the clocks CLK1 to CLK3. Therefore, if all the combination to be compared with each other is taken into consideration, the m!/2·(m−2)!-number of abnormal clock detecting sections are required for m-number of clocks.

It is necessary to compare the m-th clock CLKm with the (m−1)-number of clocks CLK1 to CLK (m−1), but FIG. 14 only shows, among them, abnormal clock detecting sections 304 and 305 for detecting abnormal conditions of the i-th clock CLKi, the j-th clock CLKj and the clock CLKm. Here, m is a natural number equal to or greater than 3, and i and j are natural numbers satisfying $\{i \neq j$ and $1 \leq i < m$, and $1 \leq j < m\}$.

Therefore, in FIG. 14, error signals ERR(n−3) and ERR(n−2) are output from the abnormal clock detecting section 304 are output to the clocks CLKm and CLKi input into the abnormal clock detecting section 304, and error signals ERR(n−1) and ERR(n) are output from the abnormal clock detecting section 305 are output to the clocks CLKm and CLKj input into the abnormal clock detecting section 305. Here, n is a natural number equal to or greater than 2·(2m−3).

Error signals EER0 to ERR(n) output in each of the abnormal clock detecting sections are input into an abnormal clock judging circuit 306. In the abnormal clock judging circuit 306, it is judged which clock is abnormal based on the input error signals ERR0 to ERR(n). Although signal lines for sending the error signals ERR0 to ERR(n) are illustrated as one signal line and connected to the abnormal clock judging circuit 306 for simplification, every signal lines of the error signals ERR0 to ERR(n) are connected to the abnormal clock judging circuit 306 actually.

Figure 15:
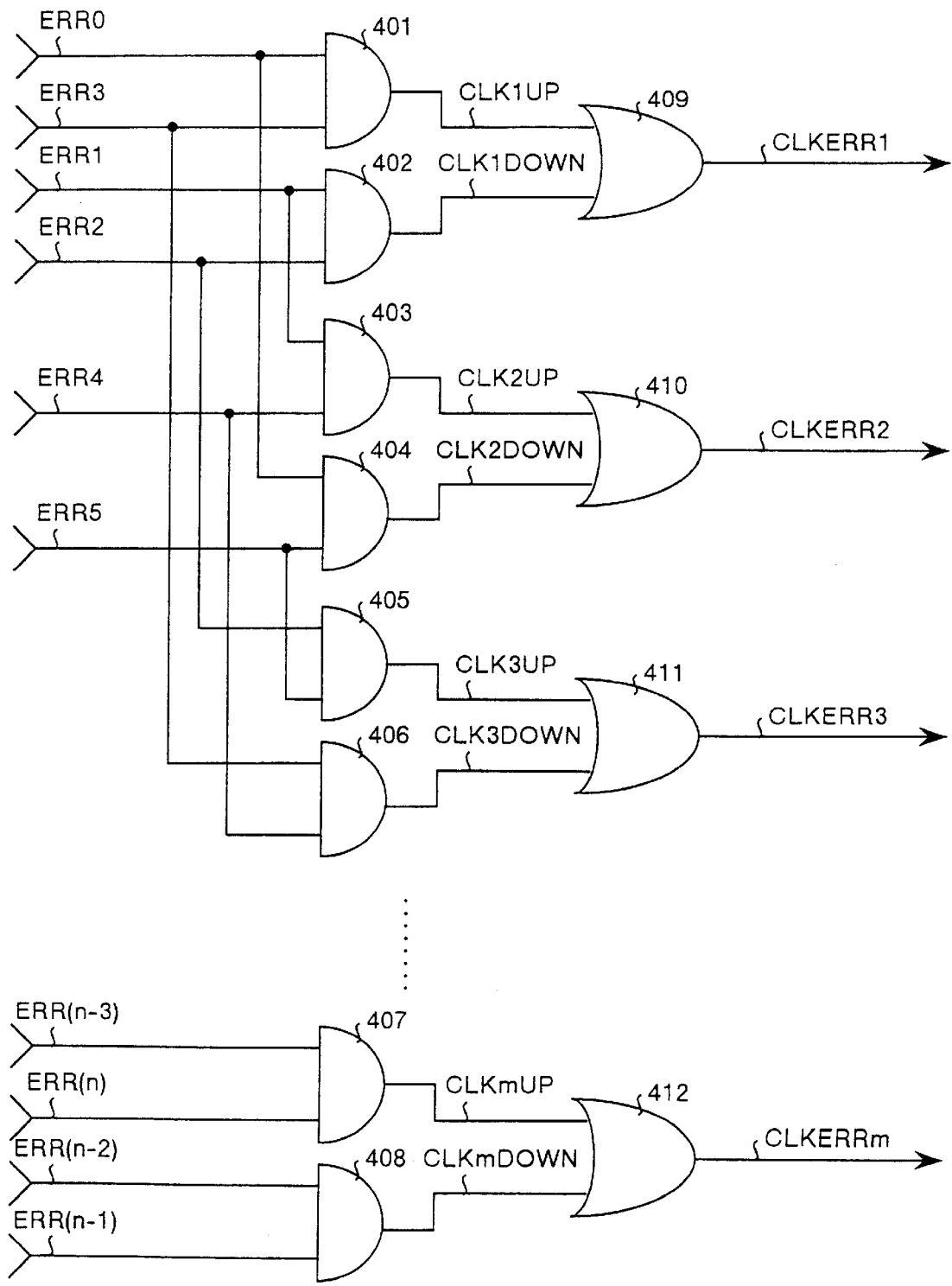
FIG. 15 is a diagram showing an internal structure of a clock comparator shown in FIG. 14.
Figure 16:
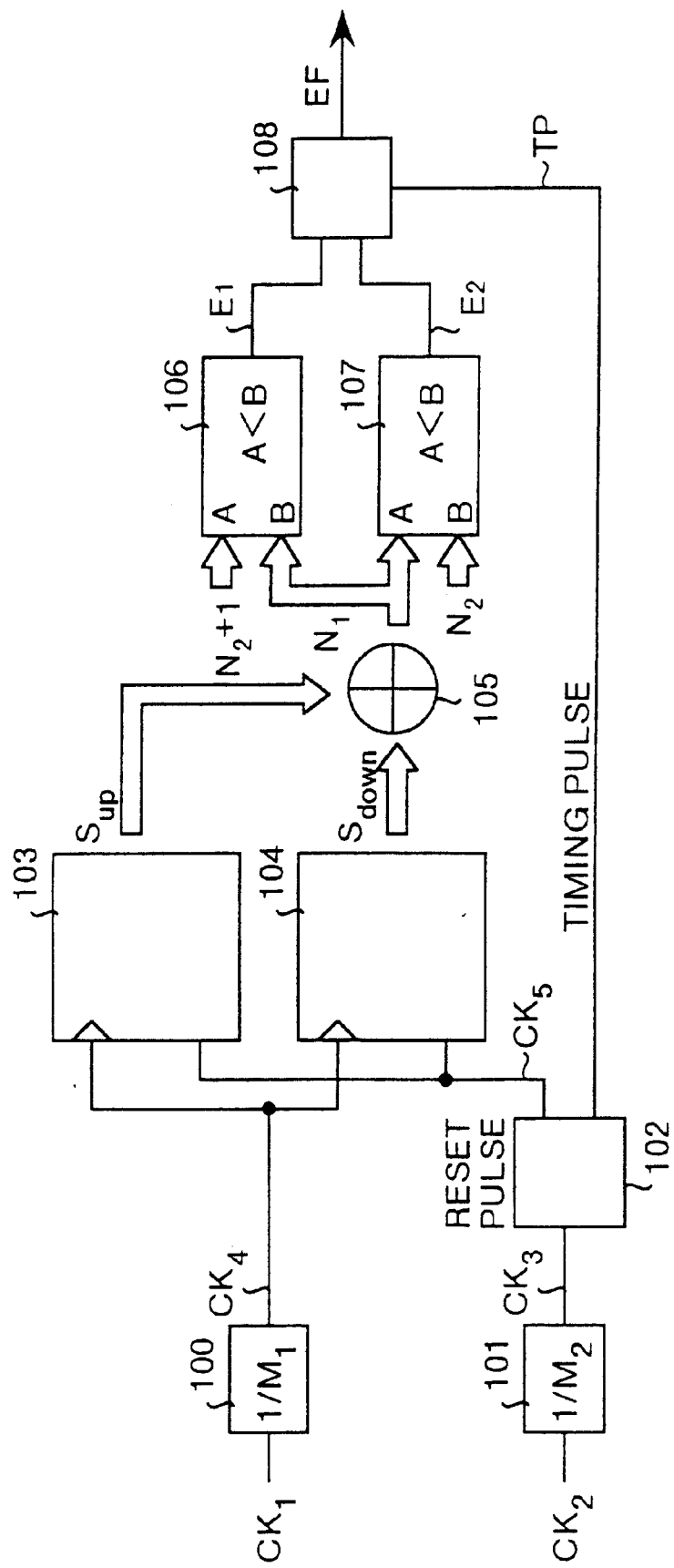
FIG. 16 is a block diagram of a conventional abnormal clock detector.

FIG. 15 is a diagram showing an internal structure of the abnormal clock judging circuit 306. In FIG. 15, the error signal ERR0 is a signal indicating that the clock CLK1 has frequency higher than its original normal frequency or the clock CLK2 has frequency lower than its original normal frequency as explained in the first embodiment. Similarly, the error signal ERR1 is a signal indicating that the clock CLK2 has frequency higher than its original normal frequency or the clock CLK1 has frequency lower than its original normal frequency, the error signal ERR2 is a signal indicating that the clock CLK3 has frequency higher than its original normal frequency or the clock CLK1 has frequency lower than its original normal frequency.

Further, the error signal ERR3 is a signal indicating that the clock CLK1 has frequency higher than its original normal frequency or the clock CLK3 has frequency lower than its original normal frequency. The error signal ERR4 is a signal indicating that the clock CLK2 has frequency higher than its original normal frequency or the clock CLK3 has frequency lower than its original normal frequency.

Further, the error signal ERR5 is a signal indicating that the clock CLK3 has frequency higher than its original normal frequency or the clock CLK2 has frequency lower than its original normal frequency. The error signal ERR(n-3) is a signal indicating that the clock CLKm has frequency higher than its original normal frequency or the clock CLKi has frequency lower than its-original normal frequency.

Further, the error signal ERR(n-2) is a signal indicating that the clock CLK1 has frequency higher than its original normal frequency or the clock CLKm has frequency lower than its original normal frequency. The error signal ERR(n-1) is a signal indicating that the clock CLKj has frequency higher than its original normal frequency or the clock CLKm has frequency lower than its original normal frequency. The error signal ERR(n) is a signal indicating that the clock CLKm has frequency higher than its original normal frequency or the clock CLKj has frequency lower than its original normal frequency.

The error signals ERR0 and ERR3 are input into an AND gate 401 and subjected to logical multiplication, and a gate signal CLK1UP is output. The gate signal CLK1UP is a signal indicating that the clock CLK1 is frequency higher than its original normal frequency. That is, since the error signals ERR0 and ERR3 show "H" level when the clock CLK1 is higher than its original normal frequency, if the gate signal CLK1UP shows "H" level, this means that the clock CLK1 is frequency higher than its original normal frequency.

The error signals ERR1 and ERR2 are input into an AND gate 402 and subjected to logical multiplication, and a gate signal CLK1DOWN is output. The gate signal CLK1DOWN is a signal indicating that the clock CLK1 is frequency lower than its original normal frequency. That is, since the error signals ERR1 and ERR2 show "H" level when the clock CLK1 is lower than its original normal frequency, if the gate signal CLK1DOWN shows "H" level, this means that the clock CLK1 is frequency lower than its original normal frequency.

The error signals ERR1 and ERR4 are input into an AND gate 403 and subjected to logical multiplication, and a gate signal CLK2UP is output. The gate signal CLK2UP is a signal indicating that the clock CLK2 is frequency higher than its original normal frequency. That is, since the error signals ERR1 and ERR4 show "H" level when the clock CLK2 is higher than its original normal frequency, if the gate signal CLK2UP shows "H" level, this means that the clock CLK2 is frequency higher than its original normal frequency.

The error signals ERR0 and ERR5 are input into an AND gate 404 and subjected to logical multiplication, and a gate signal CLK2DOWN is output. The gate signal CLK2DOWN is a signal indicating that the clock CLK2 is frequency lower than its original normal frequency. That is, since the error signals ERR0 and ERR5 show "H" level when the clock CLK2 is lower than its original normal frequency, if the gate signal CLK2DOWN shows "H" level, this means that the clock CLK2 is frequency lower than its original normal frequency.

The error signals ERR2 and ERR5 are input into an AND gate 405 and subjected to logical multiplication, and a gate signal CLK3UP is output. The gate signal CLK3UP is a signal indicating that the clock CLK3 is frequency higher than its original normal frequency. That is, since the error signals ERR2 and ERR5 show "H" level when the clock CLK3 is higher than its original normal frequency, if t he gate signal CLK3UP shows "H" level, this means that the clock CLK3 is frequency higher than its original normal frequency.

The error signals ERR3 and ERR4 are input into an AND gate 406 and subjected to logical multiplication, and a gate signal CLK3DOWN is output. The gate signal CLK3DOWN is a signal indicating that the clock CLK3 is frequency lower than its original normal frequency. That is, since the error signals ERR3 and ERR4 show "H" level when the clock CLK3 is lower than its original normal frequency, if the gate signal CLK3DOWN shows "H" level, this means that the clock CLK3 is frequency lower than its original normal frequency.

The error signals ERR(n-3) and ERR(n) are input into an AND gate 407 and subjected to logical multiplication, and a gate signal CLKmUP is output. The gate signal CLKmUP is a signal indicating that the clock CLKm is frequency higher than its original normal frequency. That is, since the error signals ERR(n-3) and ERR(n) show "H" level when the clock CLKm is higher than its original normal frequency, if the gate signal CLKmUP shows "H" level, this means that the clock CLKm is frequency higher than its original normal frequency.

The error signals ERR(n-2) and ERR(n-1) are input into an AND gate 408 and subjected to logical multiplication, and a gate signal CLKmDOWN is output. The gate signal CLKmDOWN is a signal indicating that the clock CLKm is frequency lower than its original normal frequency. That is, since the error signals ERR(n-2) and ERR(n-1) show "H" level when the clock CLKm is lower than its original normal frequency, if the gate signal CLKmDOWN shows "H" level, this means that the clock CLKm is frequency lower than its original normal frequency.

Subsequently, gate signals CLK1UP and CLK1DOWN are input into an OR gate 409 and subjected to logical multiplication, and a clock judging signal CLKERR1 is output. The clock judging signal CLKERR1 is a signal indicating that the clock CLK1 is abnormal. That is, when either one of the gate signals CLK1UP and CLK1DOWN shows "H" level, the clock judging signal CLKERR1 shows "H" level to indicate that the clock CLK1 is abnormal.

Gate signals CLK2UP and CLK2DOWN are input into an OR gate 410 and subjected to logical multiplication, and a clock judging signal CLKERR2 is output. The clock judging signal CLKERR2 is a signal indicating that the clock CLK2 is abnormal. That is, when either one of the gate signals CLK2UP and CLK2DOWN shows "H" level, the clock judging signal CLKERR2 shows "H" level to indicate that the clock CLK2 is abnormal.

Gate signals CLK3UP and CLK3DOWN are input into an OR gate 411 and subjected to logical multiplication, and a clock judging signal CLKERR3 is output. The clock judging signal CLKERR3 is a signal indicating that the clock CLK3 is abnormal. That is, when either one of the gate signals CLK3UP and CLK3DOWN shows "H" level, the clock judging signal CLKERR3 shows "H" level to indicate that the clock CLK3 is abnormal.

Gate signals CLKmUP and CLKmDOWN are input into an OR gate 412 and subjected to logical multiplication, and a clock judging signal CLKERRm is output. The clock judging signal CLKERRm is a signal indicating that the clock CLKm is abnormal. That is, when either one of the gate signals CLKmUP and CLKmDOWN shows "H" level, the clock judging signal CLKERRm shows "H" level to indicate that the clock CLKm is abnormal.

As described above, the abnormal clock judging circuit 306 outputs the clock judging signals CLKERR1 to CLKERRm indicative of abnormal condition of each of the clocks CLK1 to CLKm, respectively, based on the error signals ERR0 to ERR(n) output from the clock detectors, and can specify an abnormal clock by examining the level of the output clock judging signals CLKERR1 to CLKERRm.

Therefore, according to the abnormal clock detecting apparatus of the second embodiment, it is possible to detect a higher state having frequency higher than original normal frequency, a lower state having frequency lower than original normal frequency and a stopped state of the three or more clocks to be detected, and to specify which one of the three or more clocks is abnormal.

Further, since the clock comparator of the second embodiment detects the abnormal clock based on the maintaining period of "H" level or "L" level of the clock like the clock comparator of the first embodiment, it is possible to detect the abnormal clock even if the clock does not have its original normal duty ratio.

As explained above, according to an abnormal clock detector of the invention, it is possible to detect a higher state having frequency higher than original normal frequency, a lower state having frequency lower than original normal frequency and a stopped state of the two clocks to be detected only by the clock comparator and the frequency divider circuit without requiring complicated circuit as compared with the conventional abnormal clock detector.

According to a next abnormal clock detector of the invention, the clock comparator only comprises a shift register, an inverter gate and an OR gate, and an abnormal clock is judged utilizing a shaft of data in the shift register. Therefore, the judgment of abnormal clock can be made with a simple structure without using a special comparison operator circuit.

According to a next abnormal clock detector of the invention, the data input used in the shift register is fixed at "H" level, and the shift of data is utilized, thereby judging abnormal clock. Therefore, the judgment of abnormal clock can be made with a simple structure without requiring a special data signal necessary for the shift register.

According to a next abnormal clock detecting apparatus of the invention, it is possible to detect a higher state having frequency higher than original normal frequency, a lower state having frequency lower than original normal frequency and a stopped state of the three or more clocks to be detected, and to specify which one of the three or more clocks is abnormal.

INDUSTRIAL APPLICABILITY

As described above, the abnormal clock detector and the abnormal clock detecting apparatus are suitable for detecting a stop or an abnormal oscillation of a clock in an information processing apparatus.

What is claimed is:

1. An abnormal clock detector which receives a first clock signal and a second clock signal and detects an abnormality in the frequency of any of the first clock signal or the second clock signal, said abnormal clock detector comprising:

a first frequency divider circuit which divides the frequency of the first clock signal to output a first frequency division clock signal;

a second frequency divider circuit which divides the frequency of the first clock signal to output a first reset signal;

a third frequency divider circuit which divides the frequency of the second clock signal to output a second frequency division clock signal;

a fourth frequency divider circuit which divides the frequency of the second clock signal to output a second reset signal;

a first clock comparison circuit which receives the first frequency division clock signal and the second reset signal, counts the number of pulses of the first frequency division clock signal based on a state of the second reset signal, and outputs a first error signal indicative of abnormal clock when the counted number of pulses exceeds a predetermined value; and a second clock comparison circuit which receives the second frequency division clock signal and the first reset signal, counts the number of pulses of the second frequency division clock signal based on a state of the first reset signal, and outputs a second error signal indicative of abnormal clock when the counted number of pulses exceeds a predetermined value, wherein each of said first clock comparison circuit and said second clock comparison circuit comprises, an inverter gate inverting a state of the first reset signal or the second reset signal;

a first shift resister comprising at least two stage flip-flops which receives the first frequency division clock signal or the second frequency division clock signal as a clock input, receives the first reset signal or the second reset signal as a reset input, and outputs a first output signal;

a second shift register which receives the first frequency division clock signal or the second frequency division clock signal as a clock input, receives the first reset signal or the second reset signal inverted by said inverter gate as a reset input, and outputs a second output signal; and an OR gate for carrying out logical OR calculation of the first output signal and the second output signal to output the first error signal or the second error signal.

2. The abnormal clock detector according to claim 1, wherein said first shift register and said second shift registers fix the logical level of data input into said first flip-flop "H" level.

3. An abnormal clock detecting apparatus, comprising:

at least three clock signals;

a plurality of abnormal clock detectors in a number sufficient to enable comparison of said at least three clock signals;

an abnormal clock judging circuit which outputs clock judging signals corresponding to said at least three clock signals, indicative of abnormal clock, based on an error signal output from said abnormal clock detectors;

wherein each of said abnormal clock detectors receive a first clock signal and a second clock signal and detects an abnormality in the frequency of either of the first clock signal or the second clock signal, each abnormal clock detector comprising:

a first frequency divider circuit which divides the frequency of the first clock signal to output a fist frequency division clock signal;

a second frequency divider circuit which divides the frequency of the first clock signal to output a first reset signal;

a third frequency divider circuit which divides the frequency of the second clock signal to output a second frequency division clock signal;

a fourth frequency divider circuit which divides the frequency of the second clock signal to output a second reset signal;

a first clock comparison circuit which receives the first frequency division clock signal and the second reset signal, counts the number of pulses of the first frequency division clock signal based on a state of the second reset signal, and outputs a first error signal indicative of abnormal clock when the counted number of pulses exceeds a predetermined value; and a second clock comparison circuit which receives the second frequency division clock signal and the first reset signal, counts the number of pulses of the second frequency division clock signal based on a state of the first reset signal, and outputs a second error signal indicative of abnormal clock when the counted number of pulses exceeds a predetermined value, wherein each of said first clock comparison circuit and said second clock comparison circuit comprises, an inverter gate inverting a state of the fist reset signal or the second reset signal;

a first shift register comprising at least two stage flip-flops which receives the first frequency division clock signal or the second frequency division clock signal as a clock input, receives the first reset signal or the second reset signal as a reset input, and outputs a first output signal;

a second shift register which receives the first frequency division clock signal or the second frequency division clock signal as a clock input, receives the first reset signal or the second reset signal inverted by said inverter gate as a reset input, and outputs a second output signal; and an OR gate for carrying out logical OR calculation of the first output signal and the second output signal to output the first error signal or the second error signal.

4. The abnormal clock detecting apparatus according to claim 3, wherein said first shift register and said second shift registers fix the logical level of data input in said first flip-flop to a "H" level.

* * * * *